(12) United States Patent
Qian et al.

(10) Patent No.: US 9,490,402 B2
(45) Date of Patent: Nov. 8, 2016

(54) LED LIGHT-EMITTING DEVICE FOR WHITE LIGHT

(71) Applicant: Zhiqiang Qian, Jiangsu (CN)

(72) Inventors: Zhiqiang Qian, Jiangsu (CN); Zhengwu Jin, Jiangsu (CN)

(73) Assignee: Zhiqiang Qian, Nanjing, Jiangsu Province (CN)

( * ) Notice: Subject to any disclaimer, the term of this patent is extended or adjusted under 35 U.S.C. 154(b) by 0 days.

(21) Appl. No.: 14/376,413

(22) PCT Filed: Apr. 16, 2013

(86) PCT No.: PCT/CN2013/074279
§ 371 (c)(1),
(2) Date: Aug. 1, 2014

(87) PCT Pub. No.: WO2014/026486
PCT Pub. Date: Feb. 20, 2014

(65) Prior Publication Data
US 2015/0021635 A1    Jan. 22, 2015

(30) Foreign Application Priority Data

Aug. 17, 2012  (CN) .......................... 2012 1 0296271
Dec. 5, 2012   (CN) .......................... 2012 1 0512951
Jan. 8, 2013   (CN) .......................... 2013 1 0005784
Jan. 8, 2013   (CN) .......................... 2013 1 0006398

(51) Int. Cl.
*H01L 29/18*      (2006.01)
*H01L 33/50*      (2010.01)
*H01L 25/075*     (2006.01)
*H01L 27/15*      (2006.01)
*H01L 33/60*      (2010.01)

(52) U.S. Cl.
CPC ......... *H01L 33/504* (2013.01); *H01L 25/0753* (2013.01); *H01L 27/153* (2013.01); *H01L 33/507* (2013.01); *H01L 33/60* (2013.01); *H01L 2224/48091* (2013.01)

(58) Field of Classification Search
CPC ............... H01L 27/153; H01L 33/504; H01L 2224/48091; H01L 25/0753; H01L 2924/00014; H01L 33/507; H01L 33/60; H01L 2224/48137
USPC ............................................... 257/88; 438/29
See application file for complete search history.

(56) References Cited

U.S. PATENT DOCUMENTS

2003/0052595 A1*  3/2003  Ellens ................ C09K 11/0883
                                                                    313/501
2004/0183089 A1*  9/2004  Udagawa ...................... 257/103
2008/0142816 A1*  6/2008  Bierhuizen ............... F21K 9/00
                                                                    257/82

(Continued)

*Primary Examiner* — Duy T Nguyen
(74) *Attorney, Agent, or Firm* — Global IP Services; Tianhua Gu

(57) ABSTRACT

A white light emitting LED device comprises: base, blue light LED chips, light reflector and transparent substrate covered with a phosphor coating; two ends of the light reflector connect the base and the transparent substrate, respectively, the inner surface of the light reflector is covered with a light-reflecting coating; blue light LED chips are set on the surface of the base pointing to the transparent substrate, and the electrode leads of blue light LED chips pass through the base; blue light LED chip is a single chip, or a group of chips connected in series, or in parallel, or in a mixed manner; the transparent substrate has the shape of a plane, or a convex, or a semi-cylinder. The present invention gets the white light by utilizing the blue lights emitted by the blue light LED chips to irradiate the transparent substrate which is covered with a phosphor coating.

7 Claims, 9 Drawing Sheets

(56) References Cited

U.S. PATENT DOCUMENTS

2009/0021140 A1* 1/2009 Takasu et al. ................ 313/502
2009/0302345 A1* 12/2009 Chuang ................ H01L 33/641
　　　　　　　　　　　　　　　　　　　　　257/99
2010/0067241 A1* 3/2010 Lapatovich et al. .......... 362/361
2012/0129281 A1* 5/2012 Kim ........................ B29C 39/10
　　　　　　　　　　　　　　　　　　　　　438/26
2012/0319155 A1* 12/2012 Yoshimura ............. C09K 11/64
　　　　　　　　　　　　　　　　　　　　　257/98

* cited by examiner

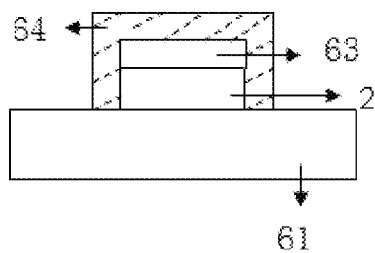
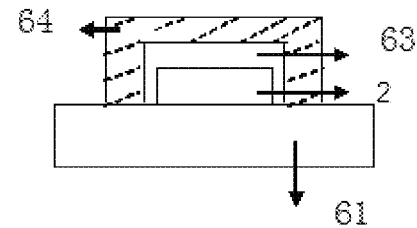
Fig. 16                Fig. 17
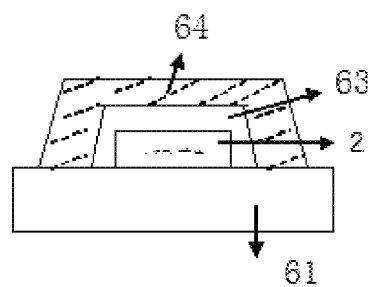
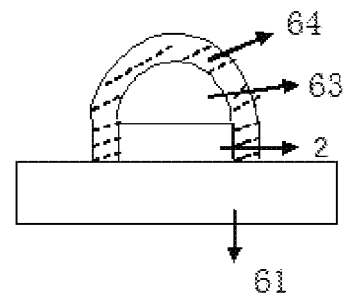
Fig. 18                Fig. 19
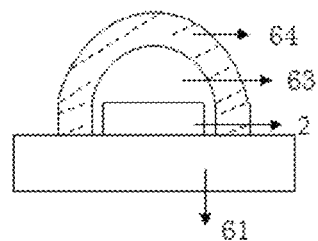
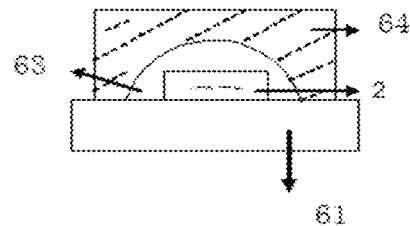
Fig. 20                Fig. 21

LED LIGHT-EMITTING DEVICE FOR WHITE LIGHT

CROSS REFERENCE TO RELATED PATENT APPLICATION

The present application is the US national stage of PCT/CN2013/074279 filed on Apr. 16, 2013 which claims the priorities of the Chinese patent applications No. 201210296271.7 filed on Aug. 17, 2012, 201210512951.8 filed on Dec. 5, 2012, 201310005784.2 filed on Jan. 8, 2013, 201310006398.5 filed on Jan. 8, 2013 which applications are incorporated herein by references.

FIELD OF THE INVENTION

This invention relates to white light emitting LED devices, especially white light emitting devices based on the transparent or semi-transparent substrate covered with the phosphor coating.

BACKGROUND OF THE INVENTION

White light emitting LEDs is an efficient and harmless lighting technology with many advantages such as energy saving, environmental protection and long life, in which the white light is obtained by combining the blue light LED chips and yellow phosphor.

As a new lighting technology white light emitting LEDs work based on the following principles: A portion of blue lights emitted by blue light LED chips irradiate the phosphors, and after excited the phosphors re-emit yellow lights with a longer wavelength, or the mixture of green lights and red lights, or the mixture of yellow lights and red lights. The lights with longer wavelength re-emitted by phosphors combine with the residual blue lights emitted by blue light LED chips to provide light which appears to the eye as being nearly white in color. In traditional LED chip-package technology, the mixture of phosphor material and silica gel or resin is blended and solidified on the surface of LED chip. The traditional LED chip-package technology shows some inherent shortcomings: the difficulty of dissipating heat during lighting results in the rising of the working temperature of LED chip, leading to a shift in the wavelength of the emitted lights by phosphors, and also leading to a degradation of photo-luminescent intensity. In addition, because phosphors are set close to the surface of LED chips, the part of the lights emitted by the blue light LED chip are re-absorbed by the blue light LED chip, resulting in the loss of lighting efficiency. As taught, for example, in CN200910036503 'A white light emitting LED' ("white LED"), white LEDs include blue light InGaN chip covered with Y-garnet phosphor re-emitting green-yellow lights after excited by a portion of blue lights emitted by blue light LED chip, and the green-yellow lights combine with the residual blue light from blue light LED chip to provide white light. As taught in CN200710079928, the white light emitting device comprises blue light LED chip and the mixture of orange phosphor and green phosphor which is solidified on the surface of blue light LED chip.

SUMMARY OF THE INVENTION

The aim of the present invention is to provide a white light emitting LED device and its manufacturing method, which utilizes a portion of blue lights emitted by blue light LED chips to irradiate the transparent or semi-transparent resin substrate covered with an organic coating containing phosphor. The described white light emitting LED device effectively solves the problems appearing in the traditional LED chip package technology. The present invention especially relates to a white light emitting LED device based on the phosphor-resin coating and its manufacturing method The present invention provide a white light emitting LED device, which comprises: base, blue light or red light LED chips, light reflector and wavelength conversion component which is composed of the transparent or semi-transparent resin substrate covered with a phosphor coating, and realizes the white light conversion of the white light emitting LED device; two ends of the light reflector connect the base and the resin substrate, respectively, and the inner surface of the light reflector is covered with a light-reflecting coating; blue light or red light LED chips were set opposite the surface of the resin substrate covered with the phosphor coating, and the electrode leads of blue light or red light LED chips pass through the base; blue light or red light LED chip is a single chip, or a group of chips connected in series, or in parallel, or in a mixed manner.

LED chips include blue light LED chips and red light LED chips; the blue light LED chips include those grown on $Al_2O_3$ single crystal substrate, or grown on SiC single crystal substrate, or grown on Si single crystal substrate, or those transferred to other substrate after grown on any one of above described three kinds of single crystal substrates; the red light LED chip includes III/V compound semiconductor red chips and their derivatives; the blue light or red light LED chip is a single chip, or a group of chips connected in series, or in parallel, or in a mixed manner; the ratio between the light flux of red light LED chips and the light flux sum of the blue light LED chips and the red light LED chips lies in the range of 0.5%~25%.

The materials of the transparent or semi-transparent resin substrate in the wavelength conversion component includes: acrylic (PMMA), PMMA resin blends, polycarbonate (PC), PC resin blends, Epoxy resin, n-butylbenzene resin, polyethylene sulfone resin (PPSU), CR-39, MS, NAS, polyurethane optical resin, polystyrene (PS), PA or PC reinforced PMMA or MS resins; the resin contained in the phosphor coating of the wavelength conversion component is the same materials with that of the transparent or semi-transparent resin substrate, or the derivatives of the resin used for the transparent or semi-transparent substrate, and the flowing ability of the resin used in the phosphor coating is better than that of the resin used for the transparent or semi-transparent substrate.

The surface of the transparent or semi-transparent resin substrate is covered with phosphor coating which is the mixture of resin and phosphor powder, and in the described phosphor coating the phosphor is LED yellow phosphor, or the mixture of LED green phosphor and LED red phosphor in any mass ratio, or the mixture of LED yellow phosphor and LED red phosphor in any mass ratio.

The phosphor coating of the wavelength conversion component has a two-layer coating structure; the thickness of each coating layer is 3 μm~5 mm; the phosphors in above described two coating layers are LED green phosphor and LED red phosphor, respectively, or LED yellow phosphor and LED red phosphor, respectively. One of the surfaces of the transparent or semi-transparent resin substrate in the wavelength conversion component is set opposite the blue light LED chip; the transparent or semi-transparent resin substrate has a one-layer or two-layer phosphor coating structure; after excited by a portion of blue lights emitted by the blue light LED chip or a group of chips in the white light emitting LED device, the phosphors contained in two phosphor coatings re-emit green lights, or red lights, or yellow lights, or the mixture of any two kinds of lights as described above; the white light is obtained by combining the lights emitted by the phosphors in the above two phosphor coatings with the residual blue lights emitted by the blue light LED chip or chips.

The transparent or semi-transparent resin substrate of the wavelength conversion component is spatially separated from blue light LED chip.

The transparent or semi-transparent resin substrate of the wavelength conversion component has the shape of a plane, or part of a ball, or a semi-cylinder, or a ellipsoid, or a spawn, or a hyperbolic cylinder, or a paraboloid. A group of light emitting LED chips are set in the base uniformly, and the surface of the above described base has a similar shape with that of the transparent or semi-transparent resin substrate, so as to get a uniform lighting spatially; the surface of the transparent or semi-transparent resin substrate is covered with an antireflection coating to reduce the reflection of lights at the interface of air and the substrate, which include the lights from blue light LED chips and the lights with a longer wavelength re-emitted by phosphor due to the excitation of a portion of blue lights emitted by LED chips.

The manufacturing steps of the wavelength conversion component related to in the present invention comprise: (1) blending the mixed powders of resin powder and phosphor powder, adhesive and organic solvent into a uniform past, wherein the mass ratio between resin powder and phosphor powder lies in the range of 100:1~20:150, and the particle size of resin powder and phosphor powder lies in the range of 1 μm~60 μm; the organic solvent includes liquid alcohol, ether, ketone, ester and hydrocarbon; the mass ratio between organic solvent and adhesive lies in the range of 100:1~100:100; the adhesive as used is any one of the following compounds: polymer, poly(1-carboxyethylene), polystyrene, ethyl cellulose ethoce, vinyl acetal polymers, which can be dissolved in the above described organic solvents; the volume ratio between the sum of resin powder and phosphor powder and the sum of organic solvent and adhesive lies in the range of 1:100~300:100; (2) coating the above described past on the surface of the transparent or semi-transparent resin substrate, and drying the above transparent or semi-transparent resin substrate covered with the past, wherein the drying temperature lies in the range of 40° C.~130° C., and the drying time lies in the range of 5 minutes~10 hours; (3) baking the above dried transparent or semi-transparent resin substrate covered with past for 5 minutes to 20 hours with a heating rate of 1~10° C./minute to get the transparent or semi-transparent resin substrate covered with a mixed coating of resin and phosphor powder, wherein the baking temperature lies in the range of 100° C.~260° C., and the cooling time lies in the range of 20 minutes~10 hours; wherein the baking process lets the organic solvent evaporated, and lets the resin powder softened, and adhesive with each other, thus the phosphor powders are embedded in resin matrix uniformly; the baking temperature is close to, but lower than the melting temperature of resin powder, and the baking temperature is at least 10° C. lower than the melting temperature of transparent or semi-transparent resin substrate.

In step (2) the baking process can be completed in air or vacuum; or step (2) and step (3) can be merged into one step-by-step heating process; the baking process can be completed by using infrared irradiation or heating wire.

UV absorber and antioxidant are also added into the mixture of resin powder and phosphor powder, and the mass ratio between resin powder and UV absorber and the mass ratio between resin powder and antioxidant lie in the range of 100:0.01~100:0.07; the described antioxidant includes antioxidant 1076, antioxidant 2246, antioxidant 245, antioxidant 1010 and Secondary antioxidant 168, etc.

The ceramic particles such as $SiO_2$, $ZrO_2$ and $Al_2O_3$ are added into the mixture of resin powder and phosphor powder, and the volume ratio between phosphor powder and ceramic particles lies in the range of 100:1~100:15 0; the ceramic particles as added reflect the lights from LED chips and phosphor powders with different wavelengths among ceramic particles, and mix these mixed lights thoroughly to get a white light with high quality.

The transparent or semi-transparent resin substrate can be manufactured as a resin wrap, and the resin wrap has different physical shapes to adjust the transport path of lights and improve the heat dissipation of the device.

The resin wrap can has the shape of a vacant cube, or a vacant semi-cylinder; the side of LED chip contacts the resin wrap, or doesn't contact the resin wrap (spatially separated); or the resin wrap has the shape of an inverse vacant pyramid or a vacant circular stage.

The resin wrap can has a mixed structure of a vacant semi-cylinder and an arc body, wherein the lower part has the shape of a vacant cylinder, the side of which contacts the blue light LED chip, and the cross section of the upper arc body is a part of a circular arc, or a parabola, or other arc curve.

The resin wrap can has the shape of a thin and long vacant arc body, and the cross section of the described arc body is a part of a circular arc, or a parabola, or other arc curve.

The resin wrap can has the shape of a semi bucket, and the cross section of the described bucket is a part of a circular arc, or a parabola, or other arc curve.

The resin wrap can has a plane shape, and the heat sink of the device with LED chip has a concave structure.

The above described resin wrap connects with the heat sink of the device through the connecting parts or adhesive.

Because the resin wrap doesn't contact with the light emitting surface of blue light LED chip, the heat generated in the device dissipates well, and the environmental temperature of the phosphor in the resin wrap is low; the above described advantages avoid the degradation of the photoluminescent intensity of the phosphor due to the high working temperature of the white light emitting LED device as happening in the traditional chip-package technology.

The manufacturing method of the resin wrap includes heat compressing technology, i.e. thermosetting and thermoplastic technology, also includes mould plastic and press plastic technology, etc.; the resin plate as obtained in above heat compressing can undertake a secondary compressing process with a model to get a device with a desired physical shape due to the fact that the flowing ability of phosphor powder is bad during the heat compressing process.

The light reflector of the white light emitting LED device in the present invention has the shape of a semi-cylinder, and the base and the transparent or semi-transparent resin substrate were the bottom and top covers of the semi-cylinder, respectively; or, the light reflector has the shape of an inverse circular stage or a bowl, and the base and the transparent or semi-transparent resin substrate were the bottom and top covers of the vacant circular stage or the bowl, respectively.

Or, the light reflector has the shape of a vacant rectangular or an inverse vacant pyramid, and the base and the transparent or semi-transparent resin substrate are the bottom and top covers of the rectangular or the inverse vacant pyramid, respectively.

Or, the light reflector has the shape of a semi-cylinder, and the base was set along a line, which is parallel to the square plane of the semi-cylinder and lies in the plane that passes through the axis of the semi-cylinder and is perpendicular to the square plane of the semi-cylinder; the transparent or semi-transparent resin substrate is the square plane of the semi-cylinder.

Or, the cross section of the light reflector is a part of a parabola, and the base was set along a line, which coincides with the focus line of the paraboloid; the transparent or semi-transparent resin substrate is the cover of the light reflector, and the described resin substrate can also have the shape of a paraboloid.

Or, the light reflector has the shape of a thin and long rectangular or an inverse pyramid, and the base and the transparent or semi-transparent resin substrate were the bottom and top covers of the rectangular or the inverse vacant pyramid, respectively.

The present invention cites the following CN patent applications as the priority of the present invention: 201310005784.2, 201210296271.7, 201210512951.8, 201310006398.5.

The benefit of the present invention includes: 1) the surface of blue light LED chip is not covered with silica gel or resin containing phosphor, so the difficulty of dissipating heat in the device is greatly relieved, and the loss of lighting efficiency resulted in by the re-absorption of the portion of the lights is avoided, wherein the described lights were re-emitted by the phosphor after excited by the blue lights from blue light LED chip; 2) the organic coating containing phosphor is separated far from the blue light LED chip spatially, and the shift in the wavelength of the emitted light by phosphors and the degradation of photo-luminescent intensity resulted in by the difficulty of dissipating heat during lighting are effectively relieved; at the same time, the degradation of the lighting efficiency of the device resulted in by the deterioration of silica gel and resin appearing in the traditional LED chip package technology is effectively avoided; in the white light emitting LED device provided in the present invention, the difficulty of dissipating heat is effectively resolved, and the environmental temperature of phosphor is low, which get rid of the degradation of photo-luminescent intensity due to the high working temperature for phosphors as happening in the traditional chip-package technology. The present invention provides the white light emitting LED device with some functions such as adjusting light transport path and improving heat dissipation. The white light is obtained in the present invention by employing blue lights emitted by LED chip to irradiate the resin wrap containing phosphor, thus the difficulty of dissipating heat in the device is greatly relieved. In addition, in the present invention PMMA has a function of anti-ageing, which ensures the light efficiency of the device.

BRIEF DESCRIPTION OF THE DRAWINGS

In order that the present invention is better understood the white light emitting LED device in accordance with the invention will now be described, by way of example only, with reference to the accompanying drawings in which the same note denotes the same part, in which:

FIG. 16 shows the schematic drawing of the white light emitting LED device in embodiment 16.

FIG. 17 shows the schematic drawing of the white light emitting LED device in embodiment 17.

FIG. 18 shows the schematic drawing of the white light emitting LED device in embodiment 18.

FIG. 19 shows the schematic drawing of the white light emitting LED device in embodiment 19.

FIG. 20 shows the schematic drawing of the white light emitting LED device in embodiment 20.

FIG. 21 shows the schematic drawing of the white light emitting LED device in embodiment 21.

DETAILED EMBODIMENTS

Figure 1:
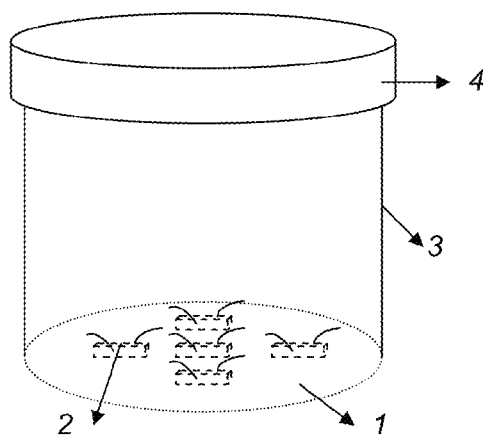
FIG. 1 shows the schematic drawing of the white light emitting LED device in embodiment 1.

The inner surface of the light reflector is covered with metal film, or the light reflector is made of metal. The materials of the transparent or semi-transparent resin substrate includes: acrylic (PMMA), PMMA resin blends, polycarbonate (PC), PC resin blends, epoxy resin, n-butylbenzene resin, polyethylene sulfone resin (PPSU), CR-39, MS, NAS, polyurethane optical resin, polystyrene (PS), PA or PC reinforced PMMA o MS resins The light reflector in the above described white light emitting LED device can have the shape of a semi-cylinder, and the base and the resin substrate are the bottom and top covers of the semi-cylinder, respectively.

The light reflector in the above described white light emitting LED device can have the shape of an inverse circular stage, and the base and the resin substrate are the bottom and top covers of the inverse circular stage, respectively.

The light reflector in the above described white light emitting LED device can have the shape of a bowl, and the base and the resin substrate are the bottom and top covers of the bowl, respectively.

The light reflector in the above described white light emitting LED device can have the shape of a rectangular, and the base and the resin substrate are the bottom and top covers of the rectangular, respectively.

The light reflector in the above described white light emitting LED device can have the shape of an inverse pyramid, and the base and the resin substrate are the bottom and top covers of the inverse pyramid, respectively.

The light reflector in the above described white light emitting LED device can have the shape of a semi-cylinder, and the base was set along a line, which is parallel to the square plane of the semi-cylinder and lies in the plane that passes through the axis of the semi-cylinder and is perpendicular to the square plane of the semi-cylinder.

The resin substrate in the above described white light emitting LED device can have a convex surface, such as a part of a ball, or a part of a hyperbolic cylinder, or a part of a paraboloid, or other convex surface.

The resin substrate in the above described white light emitting LED device can have the shape of a semi-cylinder, which cross section is a part of a circular arc, or a parabola, or a hyperbolic cylinder, or other arc curve.

The light reflector in the above described white light emitting LED device can have the shape of a thin and long rectangular (one edge is much longer than the other) or an inverse pyramid, and the base and the transparent or semi-transparent resin substrate were the bottom and top covers of the rectangular or the inverse vacant pyramid, respectively.

The cross section of the light reflector in the above described white light emitting LED device can have the shape of a parabola, and the base was set along a line, which coincides with the focus line of the paraboloid; the transparent or semi-transparent resin substrate with a square shape is the cover of the light reflector.

In the above described white light emitting LED device, the phosphor is LED yellow phosphor, or the mixture of LED green phosphor and LED red phosphor in any mass ratio, or the mixture of LED yellow phosphor and LED red phosphor in any mass ratio. The 'color', or 'color temperature', of the white light emitted of the device can be adjusted by controlling the mixing ratio of different phosphors, and the white light with any color temperature can be obtained by controlling the mixing ratio of different phosphors.

In the above described white light emitting LED device, the base can dissipate heat generated by the device, and the base is made of aluminum, or ceramics, or the modified resin.

In the following embodiments, the connection plate or connection ring is also set in order to connect the light reflector and the transparent or semi-transparent resin substrate, especially in case of the fact that the resin substrate has an un-flat surface.

The detailed embodiments attached with the accompanying drawing are described in the following part:

Embodiment 1

FIG. 1 shows the schematic drawing of the white light emitting LED device in embodiment 1, in which the white light emitting LED device comprises: the base 1, the blue light LED chips 2, the light reflector 3 and the resin substrate 4; The two ends of the light reflector 3 connect the base 1 and the resin substrate 4, and the blue light LED chips 2 were set on the surface of the base 1 pointing to the resin substrate 4; the electrode leads of blue light LED chips 2 pass through the base 1, and one of the surface of the resin substrate 4 is covered with an organic coating containing phosphor.

As one of the detailed embodiments, the phosphor can be LED yellow phosphor in order to get white light. To improve the color index of the lights as obtained in the above described device, the phosphor can be the mixture of LED green phosphor and LED red phosphor in any mass ratio, or the mixture of LED yellow phosphor and LED red phosphor in any mass ratio. The 'color', or 'color temperature', of the white light of the above described device can be adjusted by controlling the mixing ratio of different phosphors, and the lights with any desired color temperature can be obtained by controlling the mixing ratio of different phosphors.

As one of the detailed embodiments, the organic coating containing phosphor can has a two-layer structure, and the thickness of each layer lies in the range of 3 nm-5 mm. The resin used in each organic layer is same, and the phosphors in above described two coating layers are LED green phosphor and LED red phosphor, respectively, or LED yellow phosphor and LED red phosphor, respectively, but the composition of the phosphors used in each organic layer is different.

As one of the detailed embodiments, the base of the above described white light emitting LED device has a function of dissipating heat.

As one of the detailed embodiments, the blue light LED chips in the above described white light emitting LED device can be those grown on $Al_2O_3$ single crystal substrate, or grown on SiC single crystal substrate, or grown on Si single crystal substrate, or those transferred to other substrate after grown on any one of above described three kinds of single crystal substrates.

As one of the detailed embodiments, the blue light LED chips 2 can be a single chip, or a group of chips connected in series, or in parallel, or in a mixed manner.

As one of the detailed embodiments, the light reflector 3 is set between the blue light LED chip 2 and resin substrate 3 in order to reflect a portion of blue lights emitted by the blue light LED chips 2 to the organic coating containing the phosphor, and excite the phosphor, which re-emit the lights with a longer wavelength. The lights with a longer wavelength combine with the residual blue lights emitted by the blue light LED chips 2 to form white light.

As one of the detailed embodiments, the light reflector has the shape of a semi-cylinder, which inner surface is covered with metal film to enhance the reflection of lights.

Embodiment 2

Figure 2:
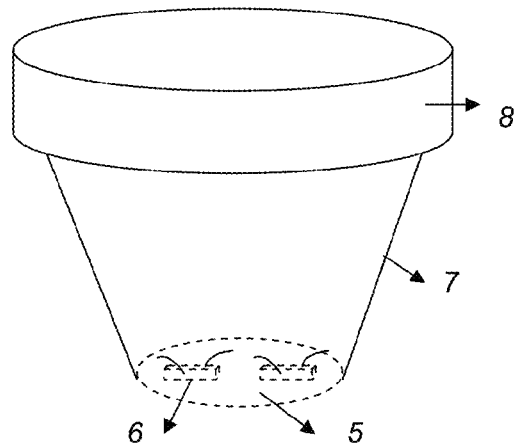
FIG. 2 shows the schematic drawing of the white light emitting LED device in embodiment 2.

FIG. 2 shows the schematic drawing of the white light emitting LED device in embodiment 2, in which the difference with that described in embodiment 1 is that the light reflector 7 has the shape of an inverse circular stage, and the base 5 and the resin substrate 8 were the bottom and top covers of the inverse circular stage, respectively.

Embodiment 3

Figure 3:
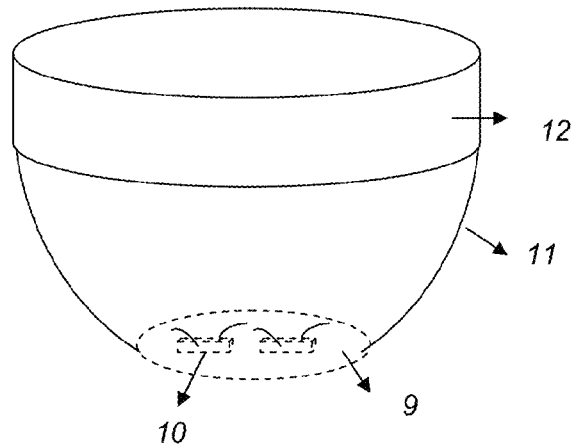
FIG. 3 shows the schematic drawing of the white light emitting LED device in embodiment 3.

FIG. 3 shows the schematic drawing of the white light emitting LED device in embodiment 3, in which the difference with that described in embodiment 1 is that the light reflector 11 has the shape of a bowl, and the base 9 and the resin substrate 12 were the bottom and top covers of the bowl, respectively.

Embodiment 4

Figure 4:
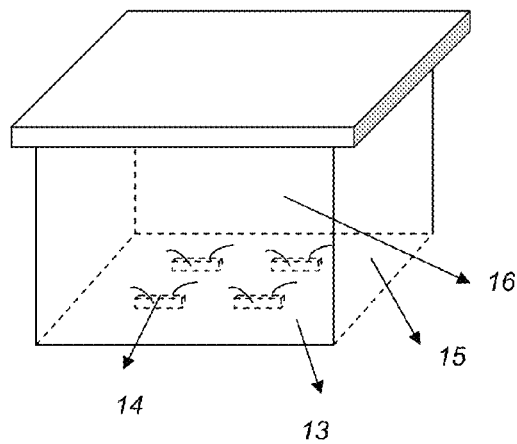
FIG. 4 shows the schematic drawing of the white light emitting LED device in embodiment 4.

FIG. 4 shows the schematic drawing of the white light emitting LED device in embodiment 4, in which the difference with that described in embodiment 1 is that the light reflector has the shape of a rectangular, and the base 13 and the resin substrate 17 were the bottom and top covers of the rectangular, respectively. The light reflector is composed of four rectangular reflection planes, such as plane 15 and plane 16. The geometric parameters of the group of the opposite reflection planes in four reflection planes are same, and the geometric parameters of the neighboring reflection planes, which is a cube or rectangular, can be same, or not.

Embodiment 5

Figure 5:
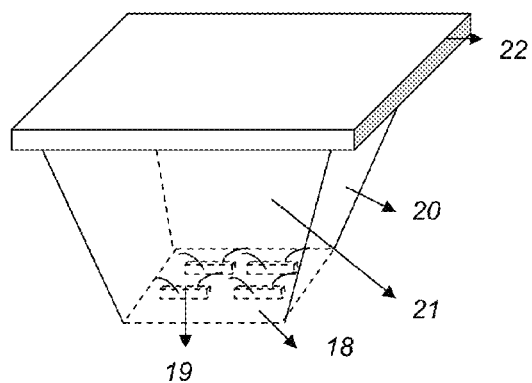
FIG. 5 shows the schematic drawing of the white light emitting LED device in embodiment 5.

FIG. 5 shows the schematic drawing of the white light emitting LED device in embodiment 5, in which the difference with that described in embodiment 1 is that the light reflector has the shape of an inverse pyramid, and the base 18 and the resin substrate 22 were the bottom and top covers of the inverse pyramid, respectively. The light reflector is composed of four inverse trapezoid reflection planes, such as plane 20 and plane 21. The geometric parameters of the group of the opposite reflection planes in four reflection planes are same, and the geometric parameters of the neighboring reflection planes can be same, or not.

Embodiment 6

Figure 6:
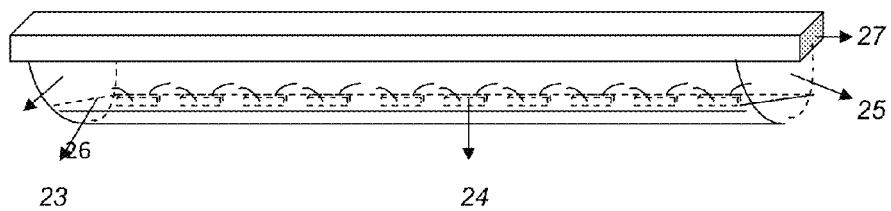
FIG. 6 shows the schematic drawing of the white light emitting LED device in embodiment 6.

FIG. 6 shows the schematic drawing of the white light emitting LED device in embodiment 6, in which the difference with that described in embodiment 1 is that the light reflector has the shape of a semi-cylinder, which has the reflection planes 25 and 26, and the base 23 and the square plane of the semi-cylinder are set parallel. Of course, the base 23 and the square plane of the semi-cylinder also can be set un-parallel, and the resin substrate 27 is employed as the square plane of the semi-cylinder.

Embodiment 7

Figure 7:
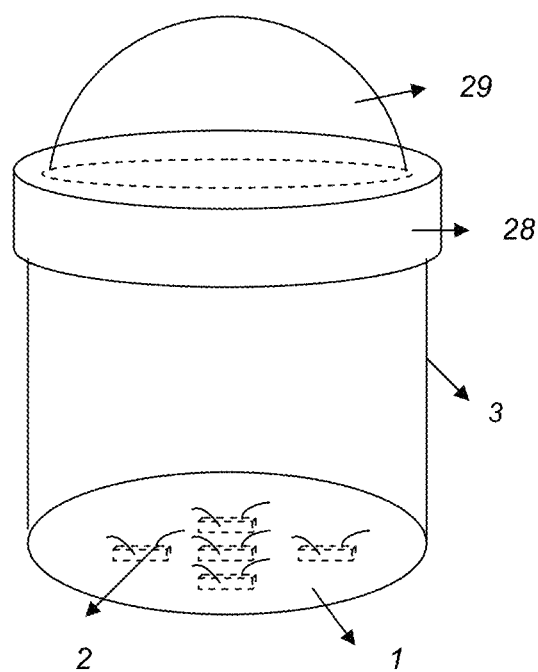
FIG. 7 shows the schematic drawing of the white light emitting LED device in embodiment 7.

FIG. 7 shows the schematic drawing of the white light emitting LED device in embodiment 7, in which the difference with that described in embodiment 1 is that the resin substrate has a convex surface, such as a part of a ball, or a part of a hyperbolic cylinder, or a part of a paraboloid, or other convex surface.

The difference with that described in embodiment 1 is that the connection part 28 is set between the light reflector and the resin substrate, and the resin substrate 29 is the cover of the device.

Embodiment 8

Figure 8:
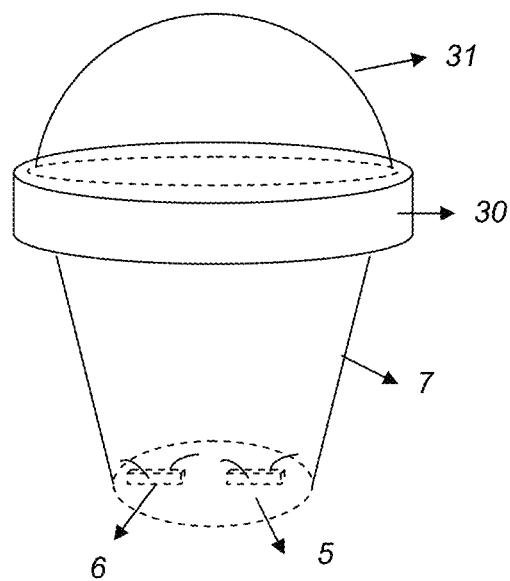
FIG. 8 shows the schematic drawing of the white light emitting LED device in embodiment 8.

FIG. 8 shows the schematic drawing of the white light emitting LED device in embodiment 8, in which the difference with that described in embodiment 1 is that the resin substrate has a convex surface, such as a part of a ball, or a part of a hyperbolic cylinder, or a part of a paraboloid, or other convex surface.

The difference with that described in embodiment 1 is that the connection part 30 is set between the light reflector and the resin substrate.

The difference with that described in embodiment 1 is that the light reflector has the shape of an inverse circular stage, and the base 5 and the resin substrate 31 are the bottom and top covers of the inverse circular stage, respectively.

Embodiment 9

Figure 9:
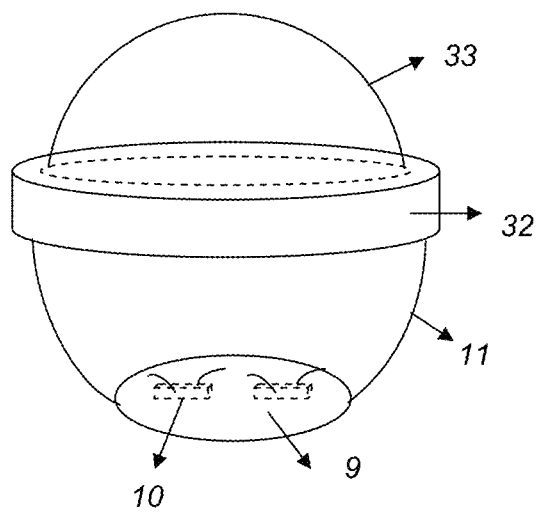
FIG. 9 shows the schematic drawing of the white light emitting LED device in embodiment 9.

FIG. 9 shows the schematic drawing of the white light emitting LED device in embodiment 9, in which the difference with that described in embodiment 1 is that the resin substrate has a convex surface, such as a part of a ball, or a part of a hyperbolic cylinder, or a part of a paraboloid, or other convex surface.

The difference with that described in embodiment 1 is that the connection part 32 is set between the light reflector and the resin substrate.

The difference with that described in embodiment 1 is that the light reflector 11 has the shape of a bowl, and the base 9 and the resin substrate 33 are the bottom and top covers of the inverse circular stage, respectively.

Embodiment 10

Figure 10:
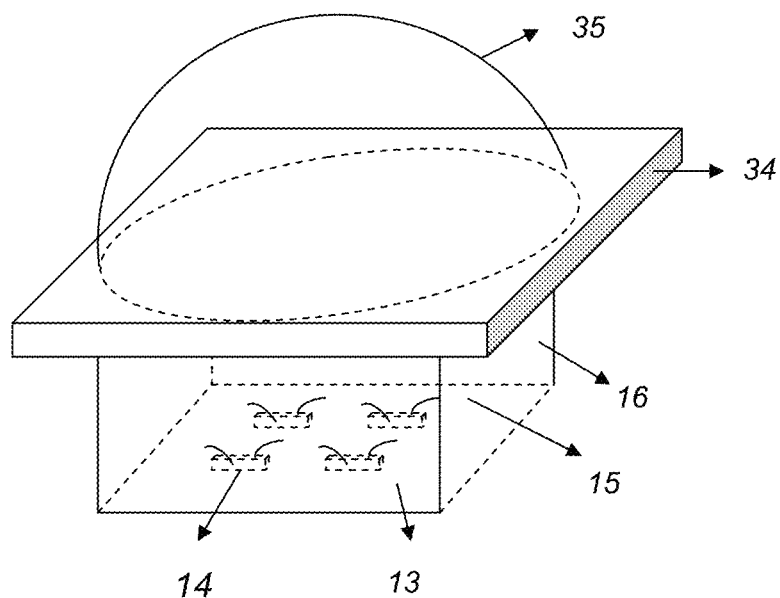
FIG. 10 shows the schematic drawing of the white light emitting LED device in embodiment 10.

FIG. 10 shows the schematic drawing of the white light emitting LED device in embodiment 10, in which the difference with that described in embodiment 1 is that the resin substrate has a convex surface, such as a part of a ball, or a part of a hyperbolic cylinder, or a part of a paraboloid, or other convex surface.

The difference with that described in embodiment 1 is that the connection part 34 is set between the light reflector and the resin substrate.

The difference with that described in embodiment 1 is that the light reflector has the shape of a rectangular, and the base 13 and the resin substrate 35 are the bottom and top covers of the rectangular, respectively. The light reflector is composed of four rectangular reflection planes, such as plane 15 and plane 16. The geometric parameters of the group of the opposite reflection planes in four reflection planes are same, and the geometric parameters of the neighboring reflection planes, which is a cube or rectangular, can be same, or not.

Embodiment 11

Figure 11:
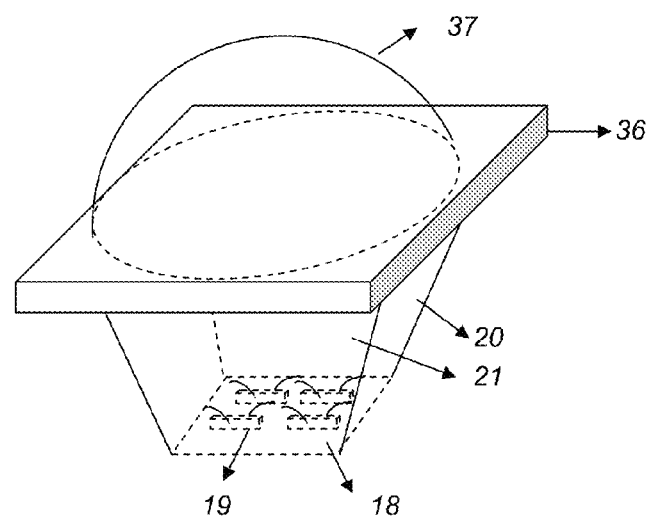
FIG. 11 shows the schematic drawing of the white light emitting LED device in embodiment 11.

FIG. 11 shows the schematic drawing of the white light emitting LED device in embodiment 11, in which the difference with that described in embodiment 1 is that the resin substrate has a convex surface, such as a part of a ball, or a part of a hyperbolic cylinder, or a part of a paraboloid, or other convex surface.

The difference with that described in embodiment 1 is that the connection part 34 is set between the light reflector and the resin substrate.

The difference with that described in embodiment 1 is that the light reflector has the shape of an inverse pyramid, and the base 18 and the resin substrate 37 are the bottom and top covers of the inverse pyramid, respectively. The light reflector is composed of four inverse trapezoid reflection planes, such as plane 20 and plane 21. The geometric parameters of the group of the opposite reflection planes in four reflection planes are same, and the geometric parameters of the neighboring reflection planes can be same, or not.

Embodiment 12

Figure 12:
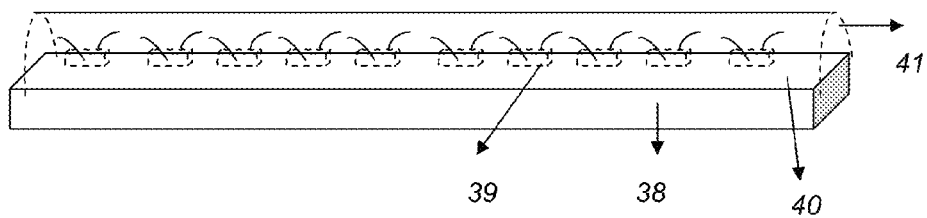
FIG. 12 shows the schematic drawing of the white light emitting LED device in embodiment 12.

FIG. 12 shows the schematic drawing of the white light emitting LED device in embodiment 12, in which the difference with that described in embodiment 1 is that the resin substrate has the shape of a semi-cylinder, and which cross section is a part of a circular arc, or a parabola, or a hyperbolic cylinder, or other arc curve.

The difference with that described in embodiment 1 is that no light reflector is set in the device, and the upper surface 40 of the base 38 is covered with metal film, which reflects lights emitted from the blue light LED chips. The difference with that described in embodiment 1 is that the resin substrate 41 is directly set on the base 38.

Embodiment 13

Figure 13:
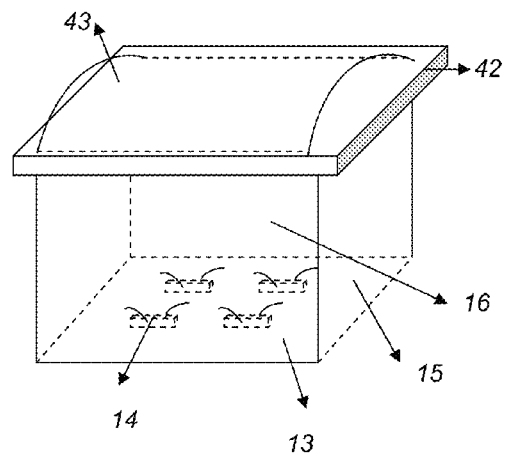
FIG. 13 shows the schematic drawing of the white light emitting LED device in embodiment 13.

FIG. 13 shows the schematic drawing of the white light emitting LED device in embodiment 13, in which the difference with that described in embodiment 1 is that the resin substrate has the shape of a semi-cylinder, and which cross section is a part of a circular arc, or a parabola, or a hyperbolic cylinder, or other arc curve.

The difference with that described in embodiment 1 is that there is a connection part 42 between the light reflector and the resin substrate.

The difference with that described in embodiment 1 is that the light reflector has the shape of a rectangular, and the base 13 and the resin substrate 43 are the bottom and top covers of the rectangular, respectively. The light reflector is composed of four rectangular reflection planes, such as plane 15 and plane 16. The geometric parameters of the group of the opposite reflection planes in four reflection planes are same, and the geometric parameters of the neighboring reflection planes, which is a square or rectangle, can be same, or not.

Embodiment 14

Figure 14:
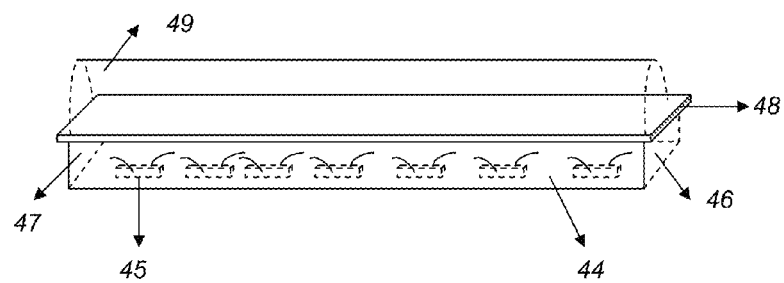
FIG. 14 shows the schematic drawing of the white light emitting LED device in embodiment 14.

FIG. 14 shows the schematic drawing of the white light emitting LED device in embodiment 14, in which the difference with that described in embodiment 1 is that the resin substrate has the shape of a semi-cylinder, and which cross section is a part of a circular arc, or a parabola, or a hyperbolic cylinder, or other arc curve.

The difference with that described in embodiment 1 is that there is a connection part 48 between the light reflector and the resin substrate.

The difference with that described in embodiment 1 is that the light reflector has the shape of a thin and long rectangular or an inverse pyramid, and the base and the resin substrate 49 are the bottom and top covers of the rectangular or the inverse pyramid, respectively. The light reflector is composed of four rectangular or trapezoid reflection planes, such as plane 46 and plane 47. The geometric parameters of the group of the opposite reflection planes in four reflection planes are same, and the geometric parameters of the neighboring reflection planes can be same, or not.

Embodiment 15

Figure 15:
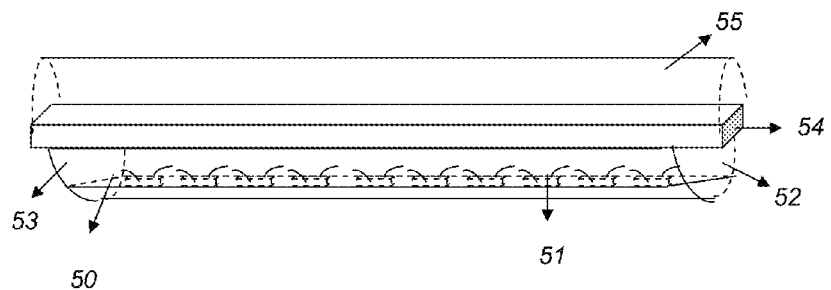
FIG. 15 shows the schematic drawing of the white light emitting LED device in embodiment 15.

FIG. 15 shows the schematic drawing of the white light emitting LED device in embodiment 15, in which the difference with that described in embodiment 1 is that the resin substrate has the shape of a semi-cylinder, and which cross section is a part of a circular arc, or a parabola, or a hyperbolic cylinder, or other arc curve.

The difference with that described in embodiment 1 is that there is a connection part 54 between the light reflector and the resin substrate.

The difference with that described in embodiment 1 is that the light reflector has the shape of a semi-cylinder, and the base was set along a line, which is parallel to the square plane of the cylinder and lies in the plane that passes through the axis of the cylinder and is perpendicular to the square plane of the cylinder; the transparent or semi-transparent resin substrate is the square plane of the semi-cylinder. The light reflector has the light reflection planes 52 and 53, and the base 50 is set parallel to the square plane of the semi-cylinder. Of course, the base 50 also can be set un-parallel to the square plane of the semi-cylinder, the base 55 is the cover of the device.

The difference with that described in embodiment 1 is that the cross section of the light reflector also can has the shape of a parabola, and the base is set along a line, which coincides with the focus line of the paraboloid.

By summarizing the above description, the heat dissipation of blue light LED chips 4 is greatly improved due to the fact that the mixture of silica-gel or resin and phosphor is not pasted directly on blue light LED chip for the package of LED chip, and at the same time the loss of lighting efficiency of the device due to the re-absorption of the lights by blue light LED chips with a longer wavelength, which is re-emitted by phosphors after the excited by a portion of blue lights from LED chips; the organic coating containing phosphor in the device is set separated far from blue light LED chips, so the wavelength shift of the emitted lights and the degradation of the photo-luminescent intensity for the phosphor due to the difficulty of dissipating heat in the device is effective relieved.

The following embodiments refers the attached FIGS. 16~25, in which the same note denotes the same part, and in the following FIG. 61 denotes heat sink; 2 denotes blue light LED chip; 64 denotes resin wrap; 63 denotes air or silica gel filled between the gap of the resin wrap and blue light LED chip; the electrodes and the leads of the electrodes are omitted because the connection technology of LED chip used in the traditional LED package technology is not changed in the present white light emitting LED device.

Embodiment 16

FIG. 16 shows the schematic drawing of the white light emitting LED device in embodiment 16, in which the resin in the phosphor-resin wrap is PMMA, and the phosphor is YAG yellow phosphor with a particle size of 10 µm.

The phosphor-resin wrap 64 has the shape of a vacant cube, or a vacant semi-cylinder with an adjustable thickness of the wall, and the side of blue light LED chip contacts the phosphor-resin wrap 64 closely.

A portion of blue lights emitted by blue light LED chip 2 irradiate the phosphor-resin wrap 64, and yellow lights emitted by the phosphor contained in the phosphor-resin wrap 64 combine with the residual blue lights emitted by blue light LED chip to form white light.

Embodiment 17

FIG. 17 shows the schematic drawing of the white light emitting LED device in embodiment 17, in which the difference with that described in embodiment 16 is that the side of blue light LED chip doesn't contact the phosphor-resin wrap.

Embodiment 18

FIG. 18 shows the schematic drawing of the white light emitting LED device in embodiment 18, in which the difference with that described in embodiment 16 is that the phosphor-resin wrap has the shape of a vacant trapezoid cube, or a vacant circular stage with an adjustable thickness of wall, and the side of blue light LED chip doesn't contact the phosphor-resin wrap.

Embodiment 19

FIG. 19 shows the schematic drawing of the white light emitting LED device in embodiment 19, in which the difference with that described in embodiment 16 is that the resin wrap has a mixed structure of a vacant semi-cylinder and an arc body, wherein the lower part has the shape of a vacant semi-cylinder, which side contacts the blue light LED chip closely, and the cross section of the upper arc body is a part of a circular arc, or a parabola, or other arc curve; the arc type of the inner arc can be the same as that of the outer arc, or not.

Embodiment 20

FIG. 20 shows the schematic drawing of the white light emitting LED device in embodiment 20, in which the difference with that described in embodiment 16 is that the resin wrap has a mixed structure of a vacant cylinder and an arc body, wherein the lower part has the shape of a vacant semi-cylinder, which side doesn't contact the blue light LED chip, and the cross section of the upper arc body is a part of a circular arc, or a parabola, or other arc curve; the arc type of the inner arc can be the same as that of the outer arc, or not.

Embodiment 21

FIG. 21 shows the schematic drawing of the white light emitting LED device in embodiment 21, in which the difference with that described in embodiment 16 is that the phosphor-resin wrap has the shape of a vacant cube, and the cross section of the vacant part is a part of a circular arc, or a part of a parabola, or other arc; the phosphor-resin wrap doesn't contact with the side of blue light LED chip.

Embodiment 22

Figure 22:
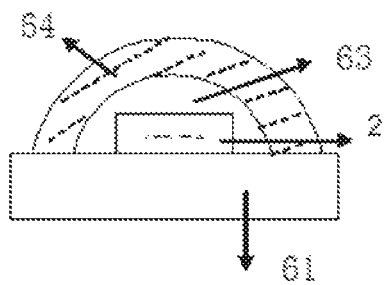
FIG. 22 shows the schematic drawing of the white light emitting LED device in embodiment 22.

FIG. 22 shows the schematic drawing of the white light emitting LED device in embodiment 22, in which the difference with that described in embodiment 16 is that the phosphor-resin wrap has the shape of a vacant arc body, and which cross section is a part of a circular arc, or a part of a parabola, or other arc; the arc type of the inner arc can be the same as that of the outer arc, or not.

Embodiment 23

Figure 23:
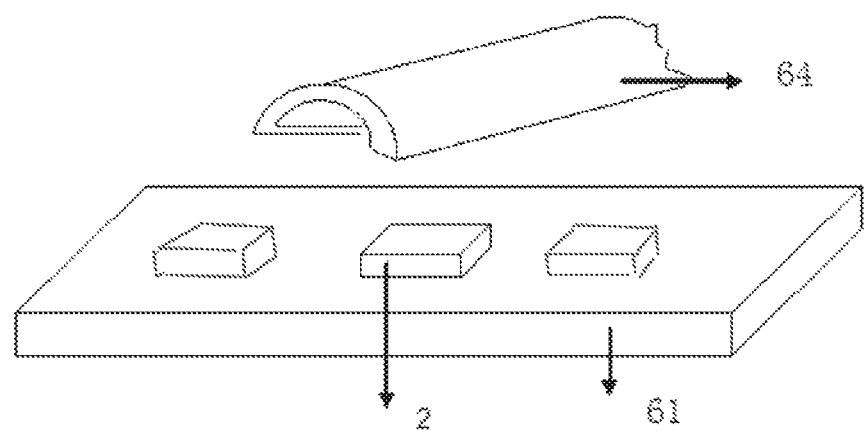
FIG. 23 shows the schematic drawing of the white light emitting LED device in embodiment 23.

FIG. 23 shows the schematic drawing of the white light emitting LED device in embodiment 23, in which the difference with that described in embodiment 16 is that the phosphor-resin wrap has the shape of a semi bucket, and which cross section is a part of a circular arc, or a parabola, or other arc curve; the arc type of the inner arc can be the same as that of the outer arc, or not.

Embodiment 24

Figure 24:
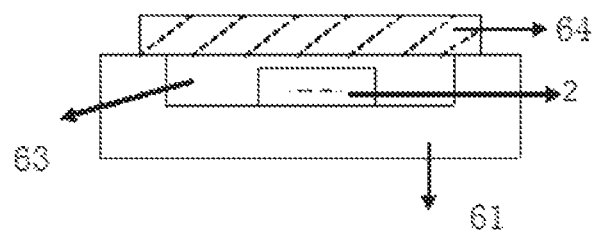
FIG. 24 shows the schematic drawing of the white light emitting LED device in embodiment 24.

FIG. 24 shows the schematic drawing of the white light emitting LED device in embodiment 24, in which the difference with that described in embodiment 16 is that the phosphor-resin wrap has the shape of a plate, and the heat sink of the device integrated with LED chip has a concave structure.

Embodiment 25

Figure 25:
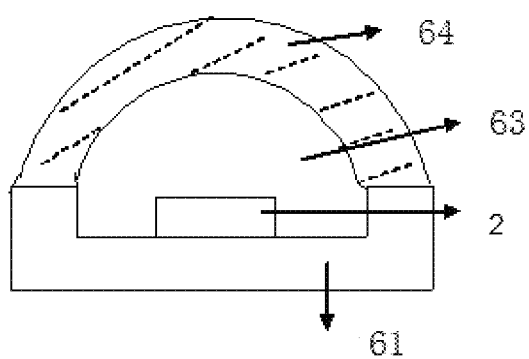
FIG. 25 shows the schematic drawing of the white light emitting LED device in embodiment 25.

FIG. 25 shows the schematic drawing of the white light emitting LED device in embodiment 25, in which the difference with that described in embodiment 16 is that the phosphor-resin wrap (it can be made from many kinds of transparent or semi-transparent resin, and the manufacturing methods can be cited from our related patent applications) has the shape of a vacant arc body, and which cross section is a part of a circular arc, or a part of a parabola, or other arc; the arc type of the inner arc can be the same as that of the outer arc, or not; and the heat sink of the device with LED chip has a concave structure.

The further improvements on the present invention include: a little UV absorber and antioxidant can be also added into the mixture of resin powder and phosphor powder to prevent the fatigue of the resin. In step (1) a proper amount of ceramic particles, such as $SiO_2$, $ZrO_2$, $Al_2O_3$, are added to enhance the mixing effect of different lights. The phosphor-resin wrap can be manufactured by taking a secondary heat-compressing process with a model to get a device with a desired physical shape: first, the plate of the mixture of resin powder and phosphor powder is obtained by employing the thermosetting and thermoplastic technology, and then the phosphor-resin component with a desired physical shape is obtained by employing a secondary heat-compressing process.

In the following embodiments, the manufacturing method of the phosphor-resin component (resin wrap) related in the present invention includes: mixing phosphor powder and resin powder thoroughly, in addition including UV absorber and antioxidant, and then compressing the described mixture by employing the thermosetting and thermoplastic technology to get the phosphor-resin component. In the phosphor-resin component the resin used includes PMMA, PC and other transparent resin (including epoxy resin, n-butylbenzene resin, polyethylene sulfone resin), and the phosphor is LED yellow phosphor. To improve the color index (CI) of the white light of the described white light emitting LED device, the phosphor can be also the mixture of LED green phosphor and LED red phosphor, or the mixture of LED yellow phosphor and a little LED red phosphor.

Embodiment 26

In the present embodiment, the raw materials of resin is PMMA VH001 in optical class with a particle size of 5 μm. The phosphor as used is YAG yellow phosphor with a particle size of 5 μm. UV absorber as used is UV-327, and the antioxidant is antioxidant 1010. The volume ratio of PMMA and phosphor is 100:15; the mass ratio of PMMA and UV-327 is 100:0.25; the mass ratio of PMMA and antioxidant 1010 is 100:0.25.

A plate with a thickness of 0.4 mm is obtained by compressing the mixture of phosphor powder and resin powder with a model at 160° C., then cooling to room temperature to get the phosphor-resin with a flat surface.

After that, secondary a vacant cube with a thickness of 0.4 mm is obtained by compressing the phosphor-resin with a model at 130° C.

White light (126 lm/W) is obtained by irradiating the inner surface of the above described phosphor-resin wrap with an 1 W blue light LED chip grown on SiC single crystal substrate.

Embodiment 27

In the present embodiment, the temperature during the first thermosetting and thermoplastic process is 190° C., and the temperature during the secondary compressing process is 150° C.

Embodiment 28

In the present embodiment, there is no limitation on the raw materials of resin for the phosphor-resin wrap, such as PC, and the prilling and mould plastics technology are employed, respectively, in which the special parameters of mould plastics respond to the different resins. White light (118~135 lm/W) is obtained by irradiating the inner surface of the above described phosphor-resin with an 1 W blue light LED chip grown on SiC single crystal substrate. In the present embodiment the resins, such as acrylic (PMMA), PMMA resin blends, polycarbonate (PC), PC resin blends, Epoxy resin, n-butylbenzene resin, polyethylene sulfone resin (PPSU), CR-39, MS, NAS, polyurethane optical resin, polystyrene (PS), PA or PC reinforced PMMA o MS resins, can be selected to get the phosphor-resin wrap with good quality. The volume ratio between resin and phosphor is not limited specially, such as 100:1~100:150, generally 100: 20~100:50.

The above described embodiments are only sought optimally. It should be noted that some other improvements and modifications on the present invention can be also proposed by the popular technicians in the present field, and the described possible improvements and modifications on the present invention should be included in the protection framework of the present invention.

What is claimed is:

1. A LED light-emitting device for white light comprising:
    a heat sink;
    a multiple of blue light LED chips fixed on the heat sink; and
    a phosphor-resin wrap covered on the sink to wrap the multiple of blue light LED chips therein, the phosphor-resin wrap is spatially separated from the multiple of blue light LED chips to create an air space;
    the phosphor-resin wrap is made by hot mould pressing of mixture of resin powder with phosphor powder selected from one of YAG yellow phosphor, mixture of LED green phosphor and LED red phosphor and mixture of LED yellow phosphor with a little of LED red phosphor;
    wherein ceramic particles of $SiO_2$, $ZrO_2$ and $Al_2O_3$ are added into the mixture of resin powder with phosphor powder, and the volume ratio between the phosphor powder and the ceramic particles is in the range of 100:1 to 100:150.

2. The LED light-emitting device for white light of claim 1, wherein the resin powder is powder of acrylic (PMMA), PMMA resin blends, polycarbonate(PC), PC resin blends, Epoxy resin, n-butylbenzene resin, polyethylene sulfone resin(PPSU), CR-39, MS, NAS, polyurethane optical resin, polystyrene(PS), PA, PC reinforced PMMA or MS resins.

3. The LED light-emitting device for white light of claim 1, wherein UV absorber and antioxidant are also added into the mixture of resin powder with phosphor powder, and the mass ratio is in the range of 100:0.01 between the resin powder and the UV absorber, 100:0.07 between the resin powder and the antioxidant.

4. The LED light-emitting device for white light of claim 1, wherein the phosphor-resin wrap has a shape of a convex surface of a part of a ball, or a part of a hyperbolic cylinder, or a part of a paraboloid; or has a shape of a semi-cylinder with a cross section of a circular arc, or a parabola, or a hyperbolic cylinder.

5. The LED light-emitting device for white light of claim 1, wherein the heat sink has a concave structure.

6. The LED light-emitting device for white light of claim 1, wherein the multiple of blue light LED chips are kinds of blue light LED chips grown on $Al_2O_3$ single crystal substrate, or blue light LED chips grown on SiC single crystal substrate, or blue light LED chips grown on Si single crystal substrate.

7. The LED light-emitting device for white light of claim 1, wherein the multiple of blue light LED chips are a group of chips connected in series, or in parallel, or in a mixed manner.

* * * * *